United States Patent
Basker et al.

(10) Patent No.: US 9,190,328 B2
(45) Date of Patent: Nov. 17, 2015

(54) FORMATION OF FINS HAVING DIFFERENT HEIGHTS IN FIN FIELD EFFECT TRANSISTORS

(71) Applicant: International Business Machines Corporation, Armonk, NY (US)

(72) Inventors: Veeraraghavan S. Basker, Schenectady, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/168,382

(22) Filed: Jan. 30, 2014

(65) Prior Publication Data

US 2015/0214119 A1    Jul. 30, 2015

(51) Int. Cl.
*H01L 27/12* (2006.01)
*H01L 21/8238* (2006.01)
*H01L 27/11* (2006.01)
*H01L 27/092* (2006.01)

(52) U.S. Cl.
CPC .... *H01L 21/823821* (2013.01); *H01L 27/0924* (2013.01); *H01L 27/11* (2013.01)

(58) Field of Classification Search
CPC .............. H01L 21/823431; H01L 21/823821; H01L 21/823481; H01L 21/823878; H01L 21/845; H01L 27/0886; H01L 27/1207; H01L 27/1211; H01L 29/785; H01L 29/66795
USPC .......................................... 257/347; 438/283
See application file for complete search history.

(56) References Cited

U.S. PATENT DOCUMENTS

| 6,642,090 | B1 | 11/2003 | Fried et al. | |
|---|---|---|---|---|
| 7,842,559 | B2 | 11/2010 | Jakschik et al. | |
| 7,993,999 | B2 | 8/2011 | Basker et al. | |
| 8,169,025 | B2 | 5/2012 | Bedell et al. | |
| 2007/0221956 | A1 | 9/2007 | Inaba | |
| 2009/0057780 | A1 | 3/2009 | Wong et al. | |
| 2011/0133292 | A1 | 6/2011 | Lee et al. | |
| 2012/0025316 | A1 | 2/2012 | Schultz | |
| 2012/0313169 | A1* | 12/2012 | Wahl et al. | 257/347 |
| 2013/0049136 | A1* | 2/2013 | Wahl et al. | 257/401 |
| 2013/0221443 | A1* | 8/2013 | Lin et al. | 257/368 |
| 2014/0167166 | A1* | 6/2014 | Bao | 257/350 |

OTHER PUBLICATIONS

Basker et al., "Semiconductor device having SSOI substrate", U.S. Appl. No. 13/690,240, filed Nov. 30, 2012.
Orlowski et al., "Si, SiGe, Ge, and III-V Semiconductor Nanomembranes and Nanowires Enabled by SiGe Epitaxy", ECS Transactions, vol. 33, No. 6, 2010, pp. 777-789.

* cited by examiner

*Primary Examiner* — Trung Q Dang
(74) *Attorney, Agent, or Firm* — Cantor Colburn LLP; Vazken Alexanian

(57) ABSTRACT

A method includes forming at least two fins of a fin field effect transistor (finFET) on a substrate and forming an insulator layer on the at least two fins. A portion of the insulator layer at a top of a first fin of the at least two fins is removed and a sacrificial layer is formed in a top end of the first fin. The method includes etching the sacrificial layer to remove the sacrificial layer to form the first fin having a different fin height than a second fin of the at least two fins.

11 Claims, 9 Drawing Sheets

FORMATION OF FINS HAVING DIFFERENT HEIGHTS IN FIN FIELD EFFECT TRANSISTORS

BACKGROUND

The present invention relates to fin formation in fin field-effect transistors (finFETs), and more specifically, to forming fins of differing heights in finFETs.

Field-effect transistors (FETs) generate an electric field, by a gate structure, to control the conductivity of a channel between source and drain structures in a semiconductor substrate. The source and drain structures may be formed by doping the semiconductor substrate, a channel region may extend between the source and the drain on the semiconductor substrate and the gate may be formed on the semiconductor substrate between the source and drain regions.

Dimensions of finFET devices may be limited by various design considerations including available geographical space in a circuit for the finFET device and required ratios of various devices in the circuit. For example, in a static random access memory (SRAM) device, pull-up and pull-down devices must have widths (corresponding to heights in finFET devices) of predetermined ratios with respect to each other. However, the device width for a finFET device is determined by the number of fins multiplied by a fin height. Since the number of fins may be limited due to constraints on the size of the finFET circuit, the device width ratio may be limited for fins with only height.

Typically, different device widths are obtained by using different numbers of fins in different finFETs. In some designs, it is desirable to change an active area of the fins to increase performance of the finFET. For example, in a static random access memory (SRAM) design, a p-type FET (PFET) having a smaller active area is desired to obtain a weaker PFET, which increases device stability. However, since typical PFET designs use only one fin, the number of fins may not be reduced to decrease the active area of the fins.

SUMMARY

According to one embodiment of the present invention, a method includes forming at least two fins of a fin field-effect transistor (finFET) on a substrate and forming an insulator layer on the at least two fins. A portion of the insulator layer at a top of a first fin of the at least two fins is removed and a sacrificial layer is formed in a top end of the first fin. The method includes etching the sacrificial layer to remove the sacrificial layer to form the first fin having a different fin height than a second fin of the at least two fins.

According to another embodiment of the present invention, an article includes a first fin of a first fin field-effect transistor (finFET) formed on a substrate, a second fin of a second finFET formed on the substrate, and an insulator layer formed on the first fin, the second fin, and the substrate, the insulator layer exposing a top portion of the first fin and covering a top portion of the second fin. A sacrificial layer is formed in the top portion of the first fin. The sacrificial layer is configured to be removable by etching, such that a height of the first fin up to the bottom of the sacrificial layer is less than a height of the second fin Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Dimensions of finFET devices may be limited by required dimension ratios with other devices, by space requirements of a circuit, and other design considerations. Embodiments of the present invention relate to finFET devices having fins of varying heights.

Figure 1:
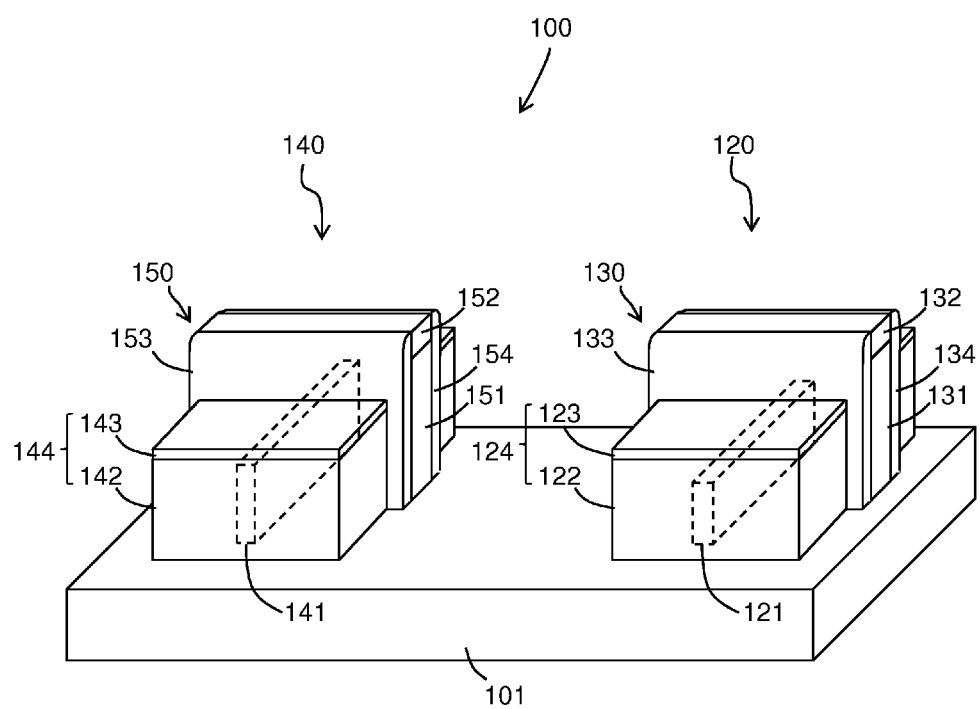
FIG. 1 illustrates a finFET semiconductor device according to an embodiment of the invention.

FIG. 1 illustrates a fin field-effect transistor (finFET) assembly 100 according to an embodiment of the present invention. The finFET assembly 100 includes a substrate 101, a first finFET device 120 and a second finFET device 140. The first finFET device 120 includes merged source/drain (SD) regions 124, including a filling layer 122 and a contact layer 123. A gate structure 130 is located between the SD regions 124. In embodiments of the invention, the finFET assembly 100 may represent an electrical circuit connecting the finFETs 120 and 140, a wafer on which the finFETs 120 and 140 are both fabricated or any other assembly including multiple finFETs 120 and 140 formed on the same substrate 101.

The second finFET device 140 also includes merged source/drain (SD) regions 144, including a filling layer 142 and a contact layer 143. The second finFET device 140 also includes a gate structure 150 is located between the SD regions 144.

The first finFET device 120 is formed around a first fin 121 located on the substrate 101, and the second finFET device 140 is formed around a second fin 140 located on the substrate 101. The first fin 121 may have a first height and the second fin 141 may have a second height different than the first fin 121. The substrate 101 may include one or more of an insulating material and a semiconductive material, such as a silicon-based material. The fins 121 and 141 may comprise a silicon-based material. In one embodiment, the filling material 122 and 142 may be an epitaxial layer, or a layer of silicon, which may be doped silicon, grown epitaxially on the first and second fins 121 and 141. In the present specification and claims, the filling material 122 and 142 may be referred to as a fill material, filling material, epitaxial fill material, or the like. The contact layers 123 and 143 may include a silicide layer. The filling layers 122 and 142 may be semiconductor layers.

The first gate structure 130 of the first finFET device 120 may include a gate stack layer 131 and a contact layer 132 on the gate stack layer 131. The gate stack layer may include one or more layers of high-dielectric constant (high-k) material under one or more multi-layer metals, doped polysilicon, and silicide. The gate structure 130 may also include insulating layers 133 and 134 disposed on sidewalls of the gate stack layer 131 and contact layer 132. Similarly, the second gate structure 150 of the second finFET device 140 may include a gate stack layer 151 and a contact layer 152 on the gate stack layer 151. The gate structure 150 may also include insulating layers 153 and 154 disposed on sidewalls of the gate stack layer 131 and contact layer 132.

In embodiments of the present invention, the fins 121 and 141 may have varying fin heights to vary the conductive characteristics of the finFET devices 120 and 140.

FIGS. 2 to 9 are described below to illustrate the formation of fins of varying heights.

Figure 2:
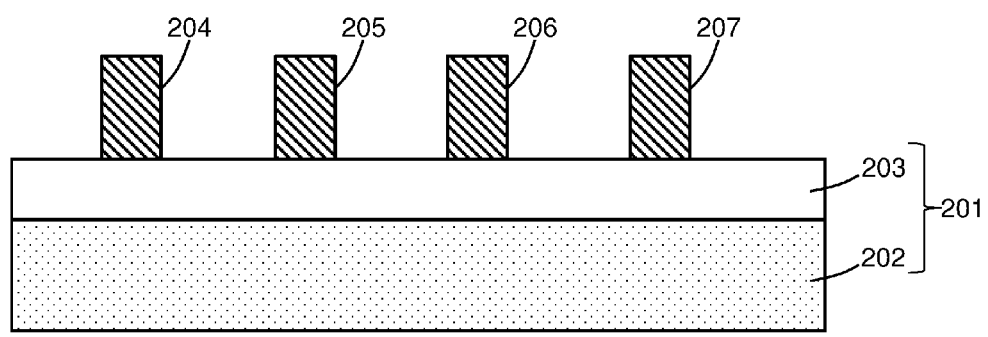
FIG. 2 illustrates forming fins on a substrate.

Referring to FIG. 2, a first fin 204, a second fin 205, a third fin 206, and a fourth fin 207 are formed on a substrate 201. In one embodiment, the substrate 201 is made up of a base substrate layer 202 and an insulation layer 203. In one embodiment, the first to fourth fins 204 to 207 are made of silicon. The first to fourth fins 204 to 207 may be formed by any process, including deposition, etching, or any other process. The base substrate 202 may be made of any semiconductor material including: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In general, base substrate 202 and first to fourth fins 204 to 207 may include either identical or different semiconducting materials with respect to chemical composition, dopant concentration and crystallographic orientation. The first to fourth fins 204 to 207 may be p-doped or n-doped to correspond to the formation of p-type field-effect transistors (PFETs) and n-type field-effect transistors (NFETs).

In one embodiment, the base substrate layer 202 is a silicon layer. In addition, the insulating layer 203 may be a buried oxide (BOX) layer, and in the present specification, the insulating layer 203 will be referred to as a BOX layer 203. The BOX layer 203 may be formed from any of several dielectric materials. Non-limiting examples include oxides, nitrides, and oxynitrides of silicon, and combinations thereof. Oxides, nitrides and oxynitrides of other elements are also envisioned. Further, the BOX layer 203 may include crystalline or non-crystalline dielectric material.

Figure 3:
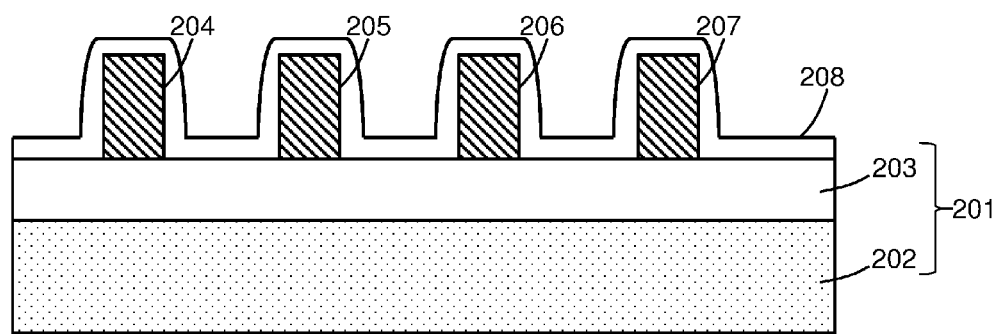
FIG. 3 illustrates forming an insulator layer on the fins on the substrate.

Referring to FIG. 3, an insulator layer 208 is formed on the first to fourth fins 204 to 207 and the substrate 201. In one embodiment, the insulator layer 208 is a nitride layer. The insulator layer 208 has a characteristic that it is resistant to etching, such as chemical etching by an etchant capable of etching the fins 204 and 207.

Figure 4:
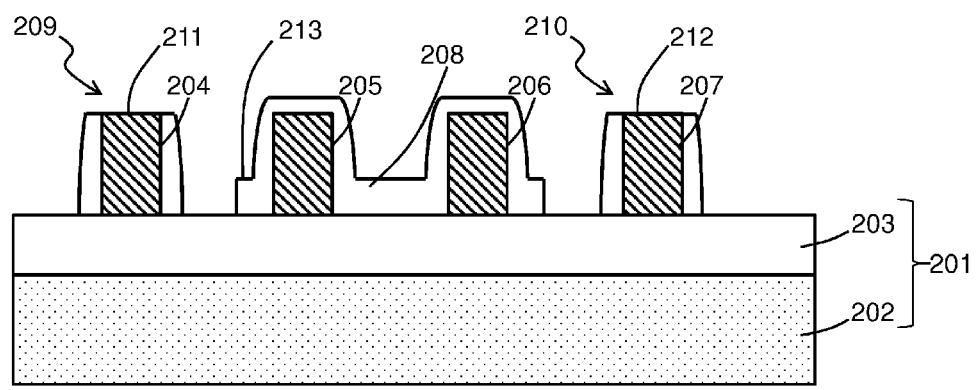
FIG. 4 illustrates selectively removing the insulating layer from a top part of fins on a substrate.

Referring to FIG. 4, a portion of the insulting layer 208 is removed from the first and fourth fins 204 and 207 to expose the top surfaces 211 and 212 of the first and fourth fins 204 and 207. The location of the removed insulator 208 is indicated by the reference numerals 209 and 210. In one embodiment, the insulator 208 is removed via chemical etching, by forming a mask (not shown) over the insulator 208 covering the second and third fins 205 and 206. However, the insulator 208 may be removed by any process, including photolithographic etching, mechanical etching, laser etching, or any other etching process.

In addition, a spacer 213 made of the insulator material may be formed at the base of the insulator 208 surrounding the second and third fins 205 and 206.

Upon exposing the top surfaces 211 and 212 of the first and fourth fins 204 and 207, sacrificial layers are formed in the first and fourth fins 204 and 207 to facilitate etching of the fins 204 and 207 to reduce the height of the fins 204 and 207.

Figure 5:
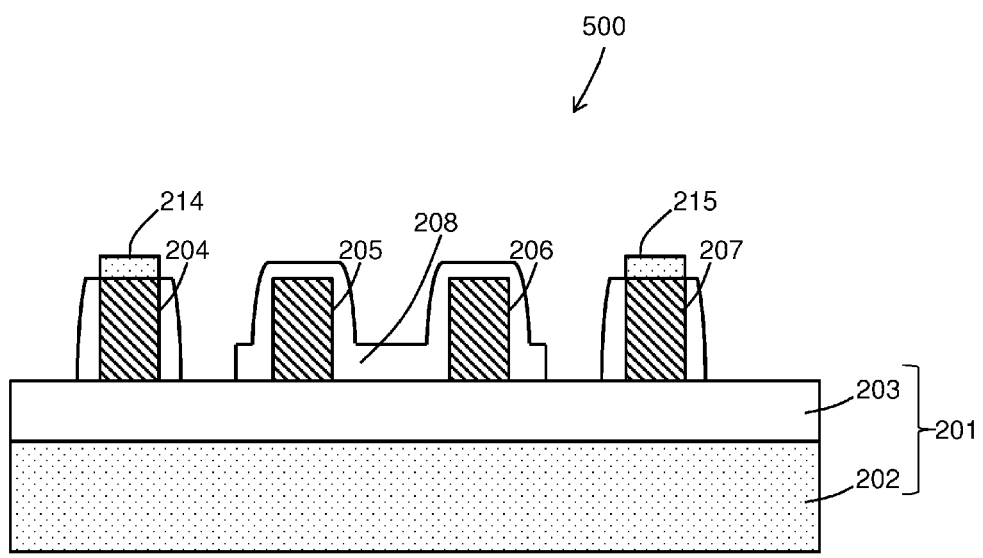
FIG. 5 illustrates depositing a sacrificial layer-forming material on exposed portions of fins.

Referring to FIG. 5, in one embodiment a layer 214 of silicon germanium (SiGe) is formed on the first fin 204 and a layer 215 of SiGe is formed on the fourth fin 207. The layers of SiGe 214 and 215 may be formed by deposition, by epitaxial growth, or by any other process. FIG. 5 illustrates the layers 214 and 215 formed by epitaxial growth on the fins 204 and 207.

Figure 6:
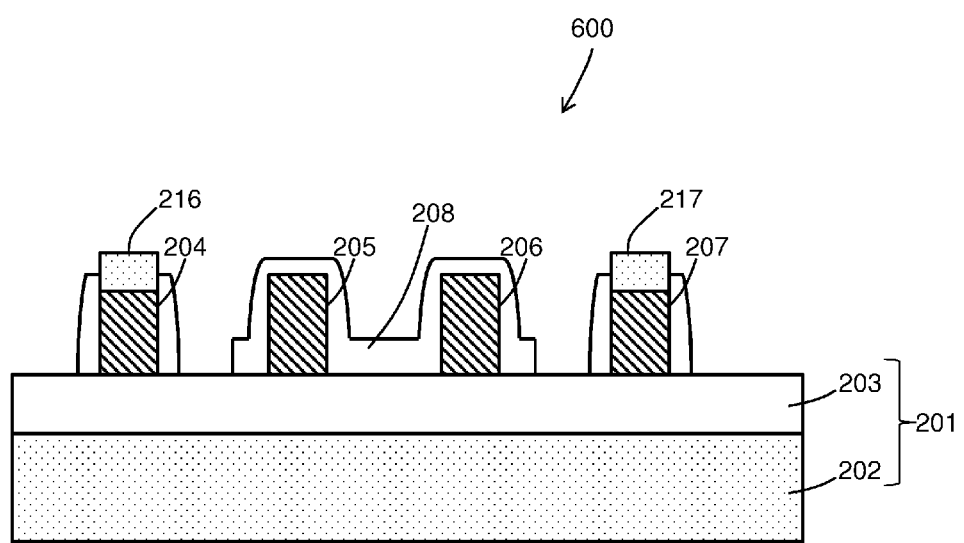
FIG. 6 illustrates annealing the sacrificial layer-forming material into the fins.

Referring to FIG. 6, the article 500 including the layers 214 and 215 of SiGe is annealed to form sacrificial regions 216 and 217. In other words, during the annealing process, the SiGe layer diffuses into the first and fourth fins 204 and 207 to physically and chemically bond with the first and fourth fins 204 and 207, resulting in the article 600 including the SiGe sacrificial regions 216 and 217. While FIGS. 5 and 6 have been described with reference to SiGe as a sacrificial layer, embodiments of the invention are not limited to SiGe, but rather embodiments encompass any material that may be annealed with the material that makes up the fins 204 and 207 to form sacrificial layers 216 and 216 that are susceptible to etching to reduce the height of the fins 204 and 207.

Figure 7:
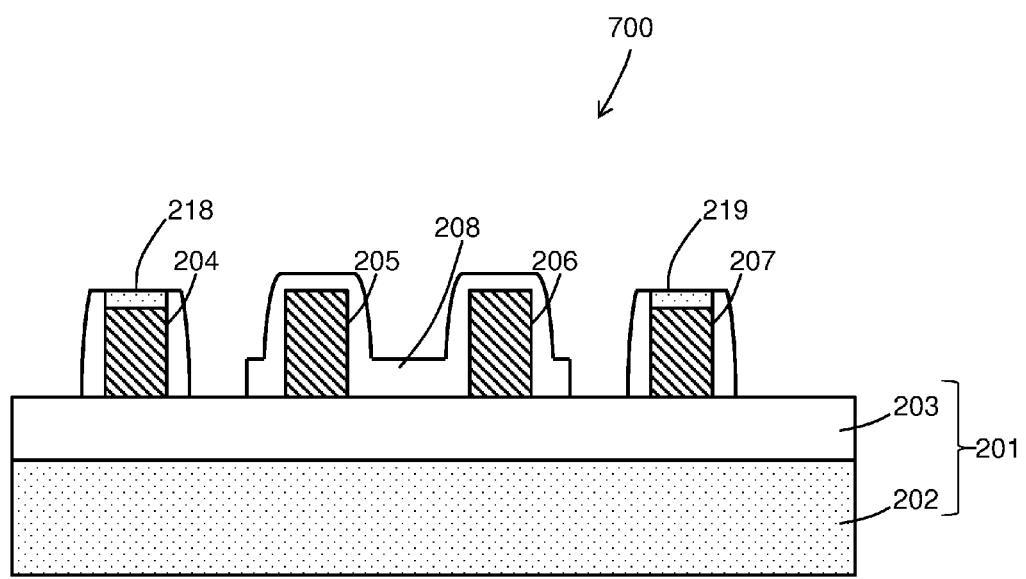
FIG. 7 illustrates oxidizing the top portion of exposed fins.

FIG. 7 illustrates an article 700 according to an alternative embodiment of the invention. Referring to FIGS. 4 and 7, the article 700 is formed by forming the sacrificial layers 218 and 219 in the top portions of the fins 204 and 207. In one embodiment, the sacrificial layers 218 and 219 are formed by oxidizing the top surfaces 211 and 212 of the first and fourth fins 204 and 207 to form sacrificial layers 218 and 219 made of a silicon oxide (SiO). However, embodiments of the invention encompass forming the sacrificial layers 218 and 219 of any material that is susceptible to etching to reduce the height of the first and fourth fins 204 and 207.

Figure 8:
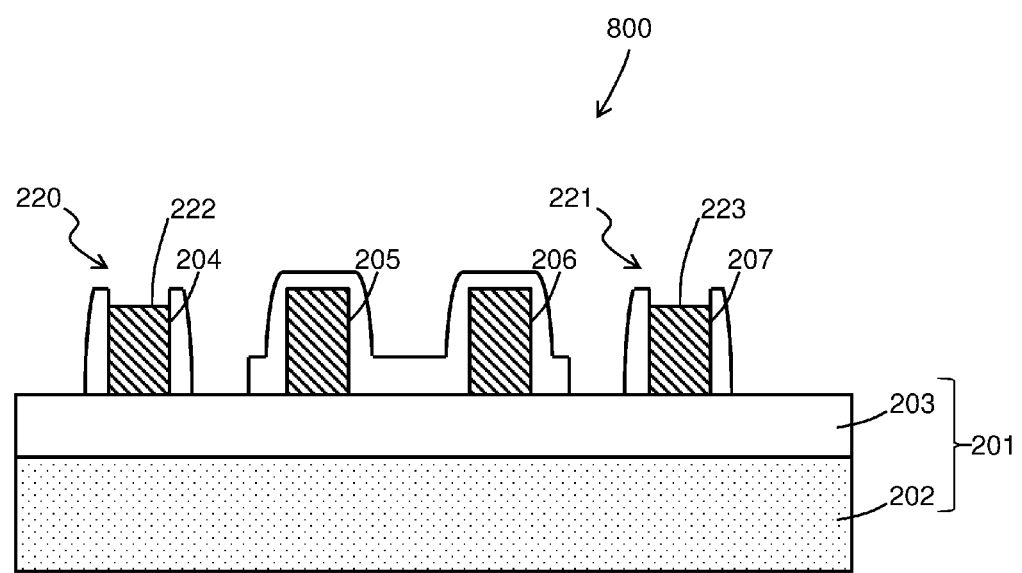
FIG. 8 illustrates removing the sacrificial layer from the fins.

Referring to FIG. 8, the article 800 is formed by etching the sacrificial layers at the top portions of the fins 204 and 207 to expose the top surfaces 222 and 223 of the fins 204 and 207. The location of the etched material is indicated by the reference numerals 220 and 221. For example, referring to FIG. 6, the sacrificial layers 216 and 217 may be etched. Similarly, referring to FIG. 7, the sacrificial layers 218 and 219 are etched. In one embodiment, the sacrificial layers are etched by chemical etching, such as exposing the article 600 of FIG. 6 or 700 of FIG. 7 to hydrochloric acid (HCl). However, embodiments of the invention are not limited to the use of HCl, and any type of etching may be performed. In particular, the etching is such that the sacrificial layers 216 and 217 or 218 and 219 are susceptible to the etching, while the insulator 208 is not susceptible to the etching, or alternatively, the insulator 208 is of a sufficient thickness that even if the etching etches the insulator 208, the etching does not affect the insulated portions of the articles 600 and 700.

Figure 9:
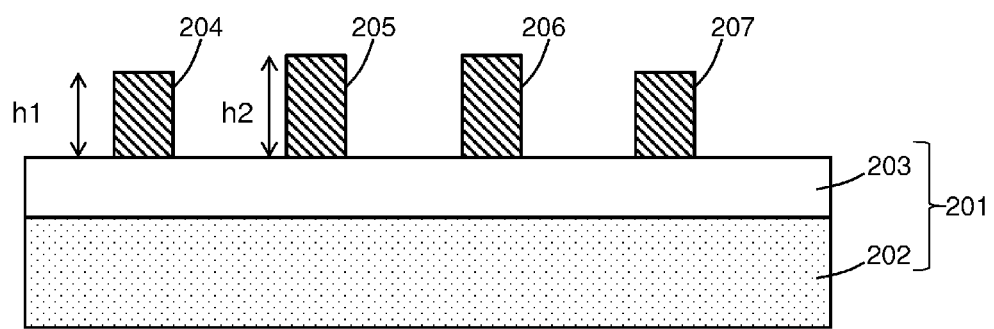
FIG. 9 illustrates removing the insulating layer from the fins.

Referring to FIG. 9, the insulator 208 is removed, exposing the fins 204, 205, 206 and 207. As illustrated in FIG. 9, the first and fourth fins 204 and 207 have heights h1 that are less than the heights h2 of the second and third fins 205 and 206. According to embodiments of the invention, the height h1 may be adjusted according to the amount, density, or other chemical characteristics of the layers 214 or 215 that form the sacrificial layers 216 and 217. The height h1 may also be adjusted according to the mount, density, or other chemical characteristics of the materials that make up the sacrificial layers 218 and 219, such as oxidizing chemical compounds.

In embodiments of the invention, the heights of the fins 204 to 207 may be adjusted based on any desired design consideration. For example, in one embodiment, the fins 204 to 207 are part of a static random access memory (SRAM) cell, the first and fourth fins 204 and 207 correspond to pFETs of the SRAM cell and the second and third fins correspond to nFETs of the SRAM cell. In such an embodiment, the height of the pFETs may be reduced to reduce current flow to improve performance of the SRAM circuit. However, embodiments of the invention encompass any type of circuit utilizing finFETs having fins of differing heights.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method, comprising:
   forming at least two fins of a fin field effect transistor (finFET) on a substrate;
   forming an insulator layer on the at least two fins;
   removing a portion of the insulator layer at a top of a first fin of the at least two fins;
   forming a sacrificial layer in a top end of the first fin;
   etching the sacrificial layer to remove the sacrificial layer to form the first fin having a different fin height than a second fin of the at least two fins;
   wherein forming the sacrificial layer comprises:
   depositing silicon germanium (SiGe) on the top of the first fin; and
   annealing the SiGe to form the sacrificial layer of SiGe in the first fin.

2. A method, comprising:
   forming at least two fins of a fin field effect transistor (finFET) on a substrate;
   forming an insulator layer on the at least two fins;
   removing a portion of the insulator layer at a top of a first fin of the at least two fins;
   forming a sacrificial layer in a top end of the first fin;
   etching the sacrificial layer to remove the sacrificial layer to form the first fin having a different fin height than a second fin of the at least two fins;
   wherein forming the sacrificial layer includes oxidizing the top of the first fin to form a silicon oxide (SiO) sacrificial layer in the first fin.

3. The method of claim 1, wherein the at least two fins includes the first fin that is part of a p-type field effect transistor (pFET) and a second fin that is part of an n-type field effect transistor (nFET), and
   removing the portion of the insulator on the top of the first fin includes masking the second fin and applying an etch material to the first and second fins to etch the top of the first fin.

4. The method of claim 1, wherein etching the sacrificial layer includes applying an etching material to the sacrificial layer.

5. The method of claim 4, wherein the etching material is hydrochloric acid (HCl).

6. The method of claim 1, further comprising:
   forming at least two gate structures on the at least two fins, respectively; and
   forming at least two contacts on opposite ends of the at least two fins on opposite sides of the at least two gate structures.

7. An article, comprising:
   a first fin of a first fin field-effect transistor (finFET) formed on a substrate;
   a second fin of a second finFET formed on the substrate;
   an insulator layer formed on the first fin, the second fin, and the substrate, the insulator layer exposing a top portion of the first fin and covering a top portion of the second fin; and
   a sacrificial layer formed in the top portion of the first fin, the sacrificial layer configured to be removable by etching, such that a height of the first fin up to the bottom of the sacrificial layer is less than a height of the second fin;
   wherein the first finFET is a p-type field-effect transistor (pFET) and the second finFET is an n-type field-effect transistor (nFET).

8. The article of claim 7, wherein the pFET and the nFET are part of a same static random access memory (SRAM) cell.

9. The article of claim 7, wherein the sacrificial layer is made of a layer of silicon germanium (SiGe) on a top surface of the first fin and annealed with first fin to form the sacrificial layer in the top portion of the first fin.

10. An article, comprising:
    a first fin of a first fin field-effect transistor (finFET) formed on a substrate;
    a second fin of a second finFET formed on the substrate;
    an insulator layer formed on the first fin, the second fin, and the substrate, the insulator layer exposing a top portion of the first fin and covering a top portion of the second fin; and a sacrificial layer formed in the top portion of the first fin, the sacrificial layer configured to be removable by etching, such that a height of the first fin up to the bottom of the sacrificial layer is less than a height of the second fin;
wherein the sacrificial layer is made of a silicon oxide (SiO) in the top portion of the first fin.

11. The article of claim 7, wherein the sacrificial layer is made of a material that is removable by hydrochloric acid (HCl).

* * * * *